US012618892B2

(12) United States Patent (10) Patent No.: US 12,618,892 B2
Hirao et al. (45) Date of Patent: May 5, 2026

(54) INSULATION DIAGNOSTIC DEVICE AND INSULATION DIAGNOSTIC METHOD

(71) Applicant: Toshiba Mitsubishi-Electric Industrial Systems Corporation, Tokyo (JP)

(72) Inventors: Kazuhei Hirao, Tokyo (JP); Yasuhiro Hada, Tokyo (JP); Masaki Miyazaki, Tokyo (JP)

(73) Assignee: TMEIC CORPORATION, Tokyo (JP)

( * ) Notice: Subject to any disclaimer, the term of this patent is extended or adjusted under 35 U.S.C. 154(b) by 178 days.

(21) Appl. No.: 18/681,075

(22) PCT Filed: Jul. 11, 2022

(86) PCT No.: PCT/JP2022/027278
§ 371 (c)(1),
(2) Date: Feb. 5, 2024

(87) PCT Pub. No.: WO2024/013809
PCT Pub. Date: Jan. 18, 2024

(65) Prior Publication Data
US 2024/0272220 A1　　Aug. 15, 2024

(51) Int. Cl.
*G01R 31/14* (2006.01)
*G01R 31/34* (2020.01)
*H02P 21/14* (2016.01)
(52) U.S. Cl.
CPC ........... *G01R 31/14* (2013.01); *G01R 31/343* (2013.01); *H02P 21/14* (2013.01)
(58) Field of Classification Search
CPC .... G01R 31/14; G01R 31/343; G01R 31/346; G01R 31/12; G01R 31/34; G01R 31/52; H02P 21/14

USPC ..................................... 324/765.01, 537, 500
See application file for complete search history.

(56) References Cited

U.S. PATENT DOCUMENTS

| 11,899,045 | B2 * | 2/2024 | Porter | .................. | G01R 35/005 |
| 2017/0373630 | A1 * | 12/2017 | Figie | ..................... | H02P 29/024 |
| 2024/0125840 | A1 * | 4/2024 | Agapiou | ........... | G01R 31/1272 |
| 2025/0244376 | A1 * | 7/2025 | Wagner | ................ | G01R 31/346 |

FOREIGN PATENT DOCUMENTS

JP　　　　2017-015444 A　　　1/2017

* cited by examiner

*Primary Examiner* — Giovanni Astacio-Oquendo
(74) *Attorney, Agent, or Firm* — XSENSUS LLP

(57) ABSTRACT

An insulation diagnostic device according to an embodiment performs an insulation diagnosis of a three-phase AC motor on the basis of a U-phase current, a V-phase current, and a W-phase current supplied to the three-phase AC motor, and includes: a current vector calculation module that calculates at least one of a zero sequence current vector or a negative sequence current vector on the basis of the U-phase current, the V-phase current, and the W-phase current; a reference current vector storage unit that stores a reference current vector in advance; a current difference vector calculation module that calculates a current difference vector that is a difference between a current vector calculated by the current vector calculation module and the reference current vector; and a determination module that determines an insulation state of the three-phase AC motor on the basis of the current difference vector.

6 Claims, 7 Drawing Sheets

DISPLAY OF VECTOR (PRIMARY)

Real(%)

Real(%)

DISPLAY OF VECTOR (TERTIARY)

Real(%)

DISPLAY OF VECTOR (QUINARY)

Real(%)

DISPLAY OF VECTOR (SEPTENARY)

INSULATION DIAGNOSTIC DEVICE AND INSULATION DIAGNOSTIC METHOD

CROSS-REFERENCE TO RELATED APPLICATION

This application is national stage application of International Application No. PCT/JP2022/027278, filed Jul. 11, 2022, which designates the United States, and the entire contents of which are incorporated herein by reference.

FIELD

Embodiments described herein relate generally to an insulation diagnostic device and an insulation diagnostic method.

BACKGROUND

Conventionally, an insulation diagnostic technique, such as a pressure test or an impulse test, of a three-phase AC motor has been performed in a non-operation state (off-line state) in which a stator of the motor has been removed from a power supply path.

Furthermore, an insulation diagnosis has been the determination of an absolute value between an initial value and a value after advances in deterioration.

CITATION LIST

Patent Literature

Patent Literature 1: JP 2017-015444 A

SUMMARY OF THE INVENTION

Problem to be Solved by the Invention

Meanwhile, an insulation diagnostic method performed by a conventional insulation diagnostic device has been the determination of an absolute value, and therefore the progress of deterioration that leads to a ground fault, a layer short circuit, or the like, that is, a sign of deterioration, has failed to be monitored.

Furthermore, the conventional insulation diagnostic method is performed when the motor is in the non-operation state (off-line state), and therefore the monitoring of the sign of deterioration or the determination of deterioration has also failed to be performed in an operation state in real time.

Accordingly, the present invention provides an insulation diagnostic device and an insulation diagnostic method, which are capable of performing monitoring of the progress of deterioration that leads to a ground fault, a layer short circuit, or the like, in an operation state in real time, and of immediately performing determination even in a case where the ground fault, the layer short circuit, or the like has occurred, in an operation state of a three-phase AC motor.

Means for Solving Problem

An insulation diagnostic device according to an embodiment performs an insulation diagnosis of a three-phase AC motor on a basis of a U-phase current, a V-phase current, and a W-phase current that are supplied to the three-phase AC motor. The insulation diagnostic device includes: a current vector calculation module configured to calculate at least one of a zero sequence current vector or a negative sequence current vector on the basis of the U-phase current, the V-phase current, and the W-phase current; a reference current vector storage unit configured to store a reference current vector in advance; a current difference vector calculation module configured to calculate a current difference vector that is a difference between a current vector calculated by the current vector calculation module and the reference current vector; and a determination module configured to determine an insulation state of the three-phase AC motor on the basis of the current difference vector.

DETAILED DESCRIPTION

An embodiment of the present invention will be described below with reference to the accompanying drawings. Herein, components according to the embodiment and descriptions for the components may be described in plural expressions. The components and their descriptions are examples, and are not limited to the expressions herein. The components may be specified by names that are different from the names herein. Furthermore, the components may be described in expressions that are different from the expressions herein.

Figure 1:
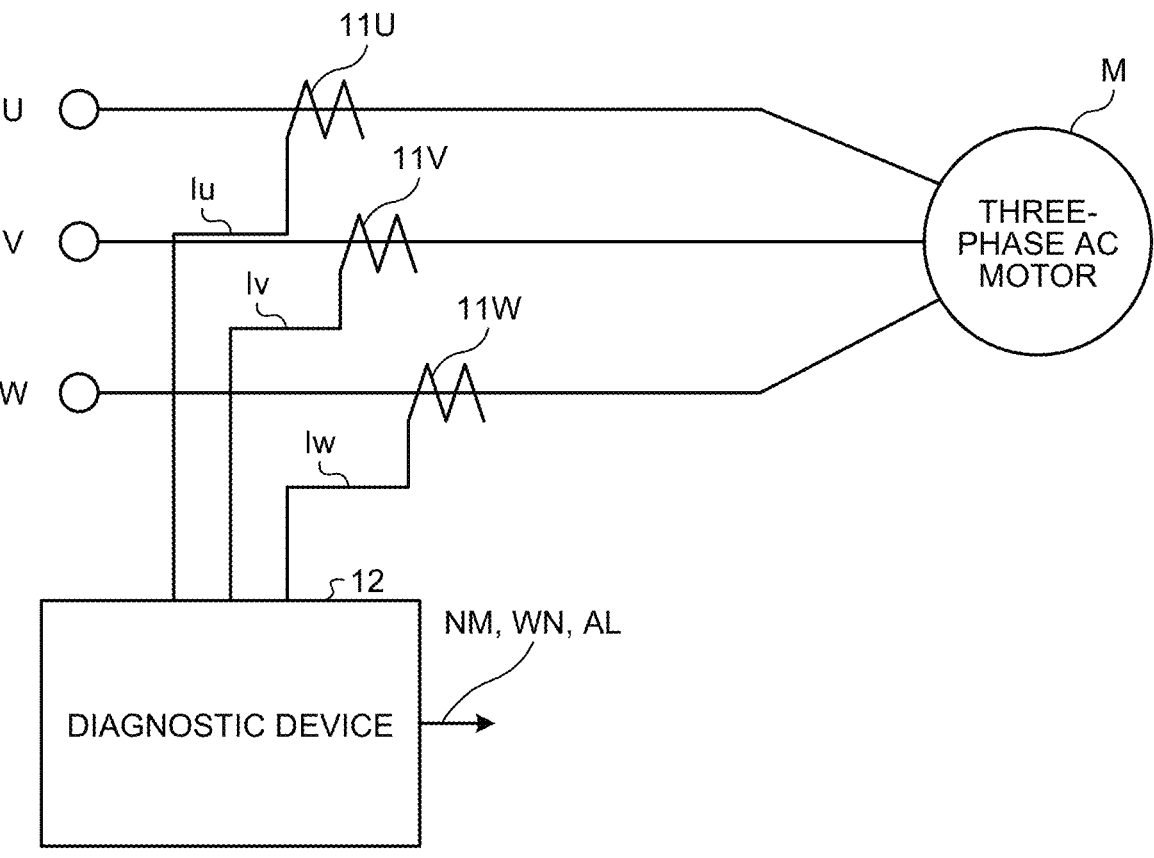
FIG. 1 is an explanatory diagram of an insulation diagnostic device according to an embodiment.

FIG. 1 is an explanatory diagram of an insulation diagnostic device according to an embodiment.

An insulation diagnostic device 10 includes a first current transformer (CT: current transformer) 11U that detects a U-phase current Iu that is supplied to a three-phase AC motor M, a second current transformer (CT) 11V that detects a V-phase current Iv that is supplied to the three-phase AC motor M, a third current transformer (CT) 11W that detects a W-phase current Iw that is supplied to the three-phase AC motor M, and a diagnostic device 12 that makes a diagnosis on the basis of the U-phase current Iu, the V-phase current Iv, and the W-phase current Iw that have been detected.

Figure 2:
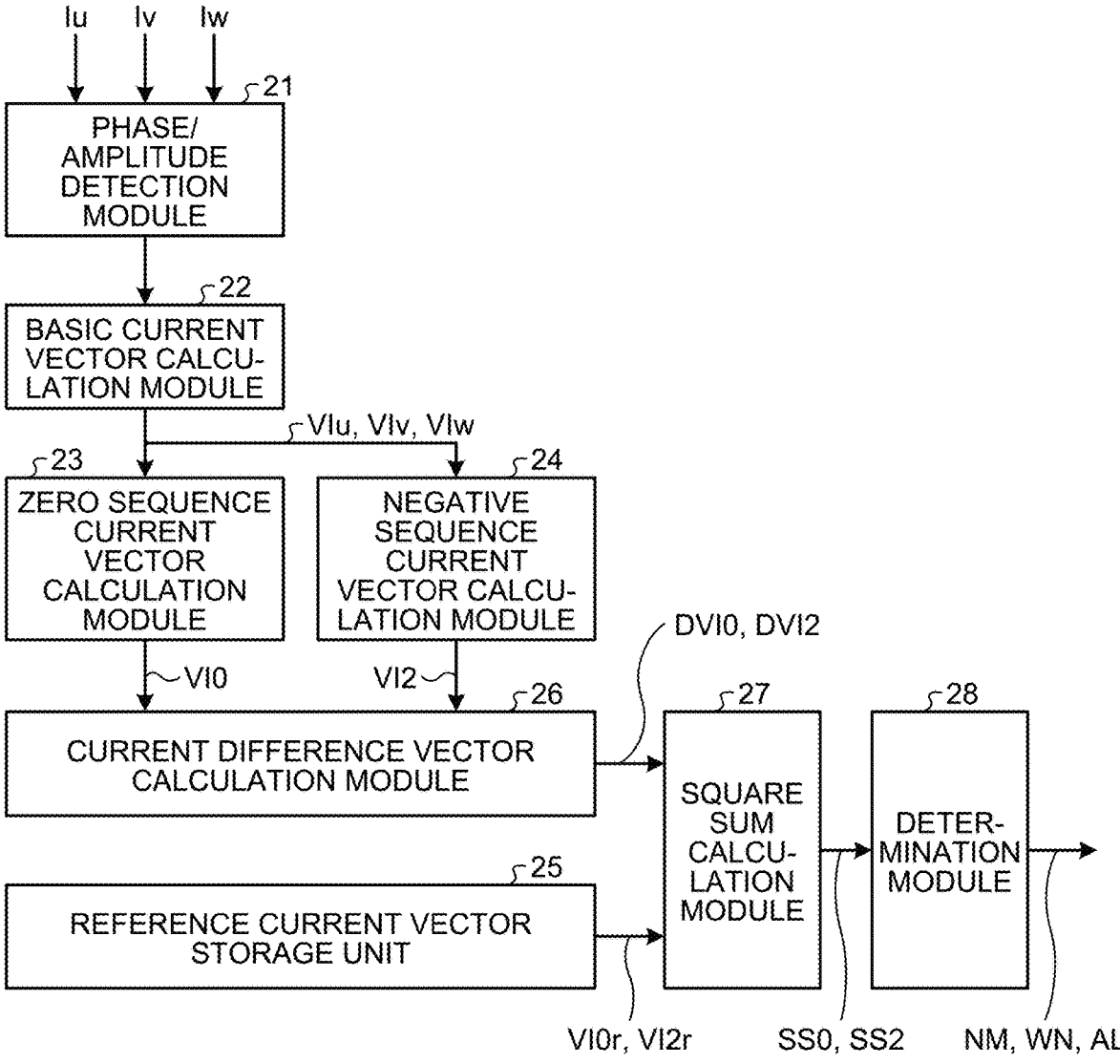
FIG. 2 is a functional block diagram of a diagnostic device.

FIG. 2 is a functional block diagram of a diagnostic device.

The diagnostic device 12 includes a phase/amplitude detection module 21, a basic current vector calculation module 22, a zero sequence current vector calculation module 23, a negative sequence current vector calculation module 24, a reference current vector storage unit 25, a current difference vector calculation module 26, a square sum calculation module 27, and a determination module 28.

In the configuration described above, the basic current vector calculation module 22, the zero sequence current vector calculation module 23, and the negative sequence current vector calculation module 24 function as a current vector calculation module.

The phase/amplitude detection module 21 detects a phase of the U-phase current Iu, a phase of the V-phase current Iv, a phase of the W-phase current Iw, an amplitude of the U-phase current Iu, an amplitude of the V-phase current Iv, and an amplitude of the W-phase current Iw on the basis of the U-phase current Iu, the V-phase current Iv, and the W-phase current Iw that have been detected.

In the description below, for example, in order to clearly describe that Iu is a vector, the expression "vector VIu" is used, and in order to clarify a correspondence relationship between description in sentences and description in formulae, VIu is written below an arrow for convenience sake.

The basic current vector calculation module 22 calculates a U-phase current vector VIu on the basis of the phase of the U-phase current Iu and the amplitude of the U-phase current Iu, calculates a V-phase current vector VIv on the basis of the phase of the V-phase current Iv and the amplitude of the V-phase current Iv, and calculates a W-phase current vector VIw on the basis of the phase of the W-phase current Iw and the amplitude of the W-phase current Iw.

The zero sequence current vector calculation module 23 calculates a zero sequence current vector VI0 according to the following formula on the basis of the U-phase current vector VIu, the V-phase current vector VIv, and the W-phase current vector VIw that have been calculated.

$$\overrightarrow{VI0} = \left( \overrightarrow{VIu} + \overrightarrow{VIv} + \overrightarrow{VIw} \right)$$

The negative sequence current vector calculation module 24 calculates a negative sequence current vector VI2 according to the following formula on the basis of the U-phase current vector VIu, the V-phase current vector VIv, and the W-phase current vector VIw that have been calculated.

$$\overrightarrow{VI2} = \left( \overrightarrow{VIu} + a^2 \overrightarrow{VIv} + a \overrightarrow{VIw} \right)$$

Here, "a" is a vector operator, and is expressed as the following:

$$a = -\frac{1}{2} + j\frac{\sqrt{3}}{2}$$

The reference current vector storage unit 25 stores, as a reference zero sequence current vector VI0r and a reference negative sequence current vector VI2r, the zero sequence current vector VI0 and the negative sequence current vector VI2 that have been calculated in a state where a ground fault, a layer short circuit, or the like has not occurred, for example, at the time of shipping or at the time of an inspection.

In practice, the reference current vector storage unit 25 stores each of a primary reference zero sequence current vector VI0r_1, which is a primary frequency component of the reference zero sequence current vector VI0r, a tertiary reference zero sequence current vector VI0r_3, which is a tertiary frequency component of the reference zero sequence current vector VI0r, a quinary reference zero sequence current vector VI0r_5, which is a quinary frequency component of the reference zero sequence current vector VI0r, and a septenary reference zero sequence current vector VI0r_7, which is a septenary frequency component of the reference zero sequence current vector VI0r.

Moreover, the reference current vector storage unit 25 stores each of a primary reference negative sequence current vector VI2r_1, which is a primary frequency component of the reference negative sequence current vector VI2r, a tertiary reference negative sequence current vector VI2r_3, which is a tertiary frequency component of the reference negative sequence current vector VI2r, a quinary reference negative sequence current vector VI2r_5, which is a quinary frequency component of the reference negative sequence current vector VI2r, and a septenary reference negative sequence current vector VI2r_7, which is a septenary frequency component of the reference negative sequence current vector VI2r.

The current difference vector calculation module 26 calculates, as a zero sequence current difference vector DVI0, a difference between the zero sequence current vector VI0 that has been calculated by the zero sequence current vector calculation module 23 and the reference zero sequence current vector VI0r that has been read out from the reference current vector storage unit 25.

Furthermore, the current difference vector calculation module 26 calculates, as a negative sequence current difference vector DVI2, a difference between the negative sequence current vector VI2 that has been calculated by the negative sequence current vector calculation module 24 and the reference negative sequence current vector VI2r that has been read out from the reference current vector storage unit 25.

Figure 3:
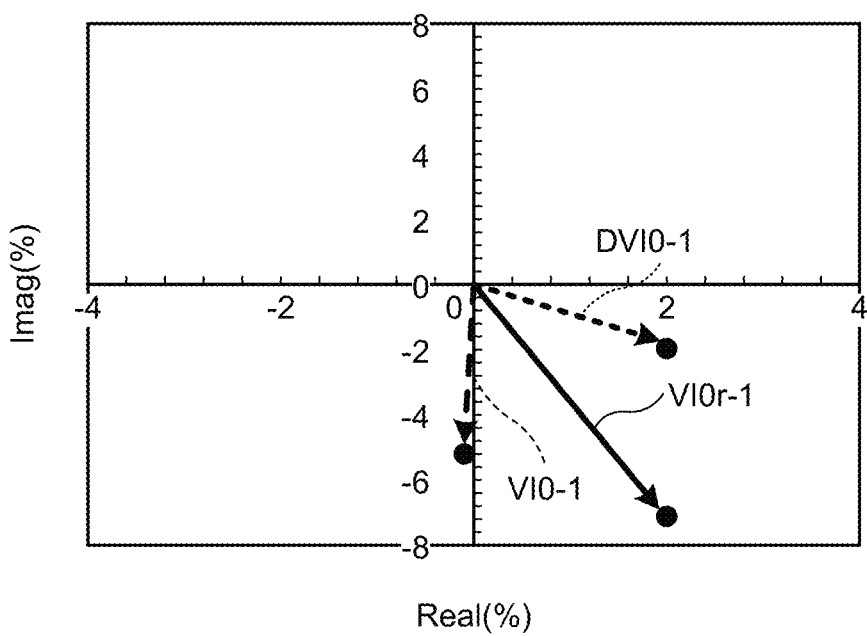
FIG. 3 is an explanatory diagram of a primary zero sequence current vector and a primary reference zero sequence current vector.

FIG. 3 is an explanatory diagram of a primary zero sequence current vector and a primary reference zero sequence current vector.

Figure 4:
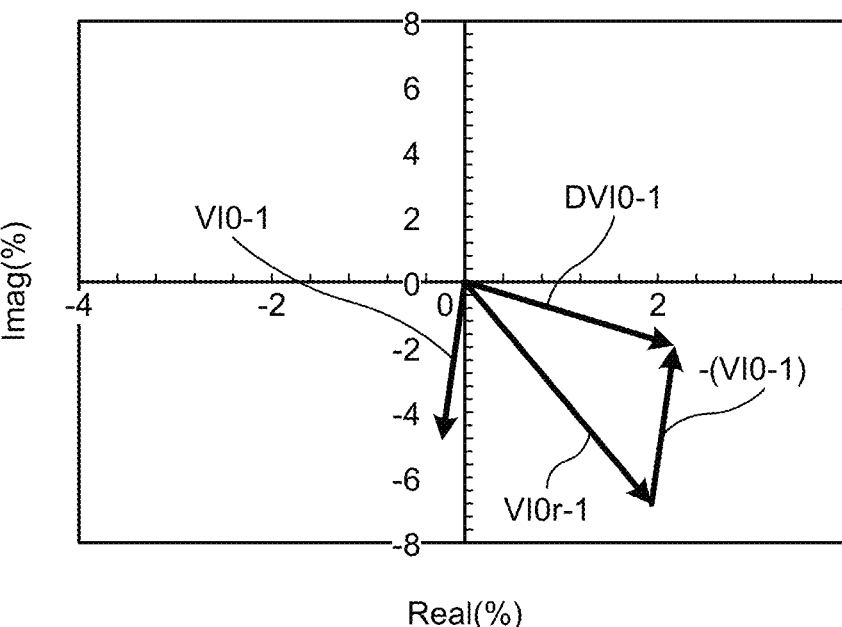
FIG. 4 is an explanatory diagram of calculation of a primary zero sequence current difference vector.

FIG. 4 is an explanatory diagram of calculation of a primary zero sequence current difference vector.

The current difference vector calculation module 26 calculates a primary zero sequence current difference vector DVI0_1, by subtracting a primary zero sequence current vector VI0__1 from the primary reference zero sequence current vector VI0r_1, as illustrated in FIG. 4.

Stated another way, the current difference vector calculation module 26 performs the processing described below.

$$\overrightarrow{DVI0\_1} = \overrightarrow{VI0r\_1} - \overrightarrow{VI0\_1}$$

Figure 5:
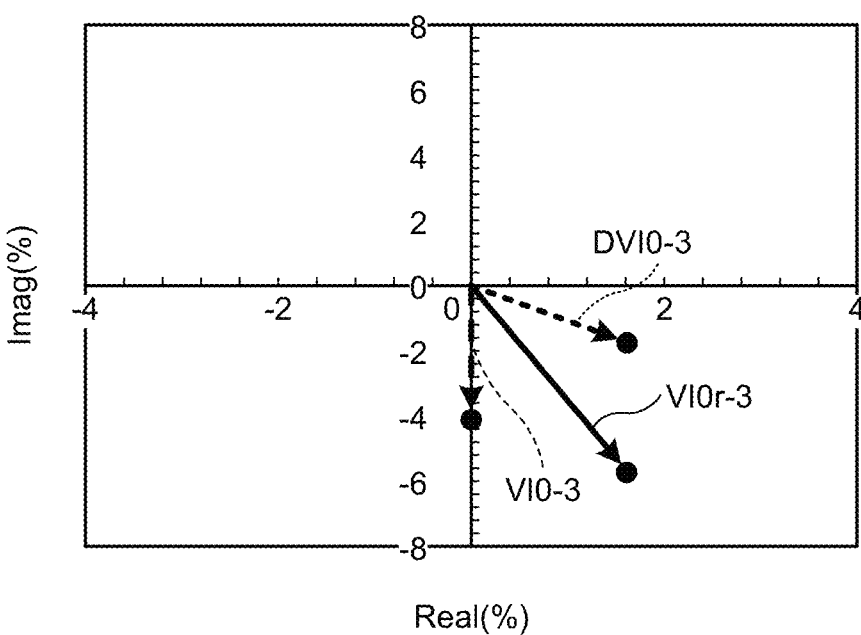
FIG. 5 is an explanatory diagram of a tertiary zero sequence current vector and a tertiary reference zero sequence current vector.

FIG. 5 is an explanatory diagram of a tertiary zero sequence current vector and a tertiary reference zero sequence current vector.

Figure 6:
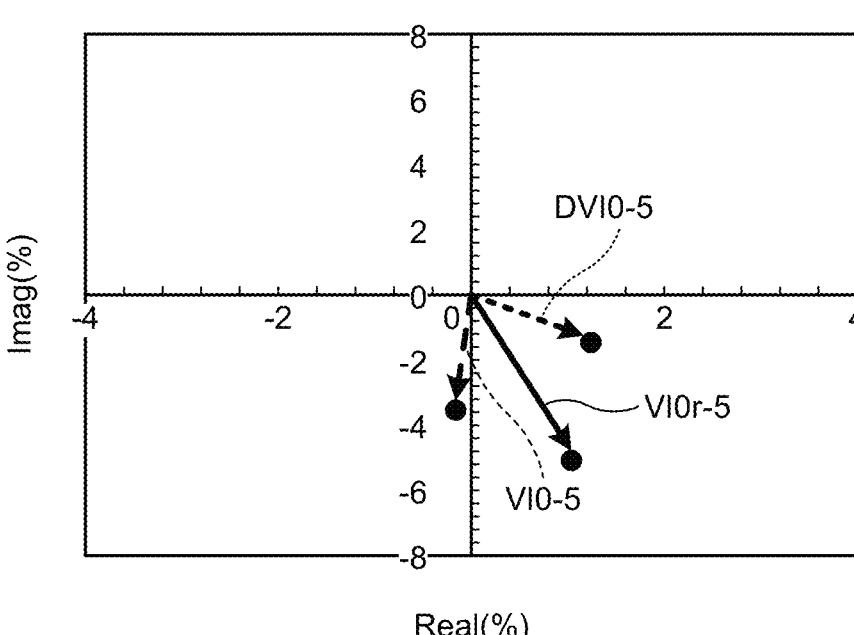
FIG. 6 is an explanatory diagram of a quinary zero sequence current vector and a quinary reference zero sequence current vector.

FIG. 6 is an explanatory diagram of a quinary zero sequence current vector and a quinary reference zero sequence current vector.

Figure 7:
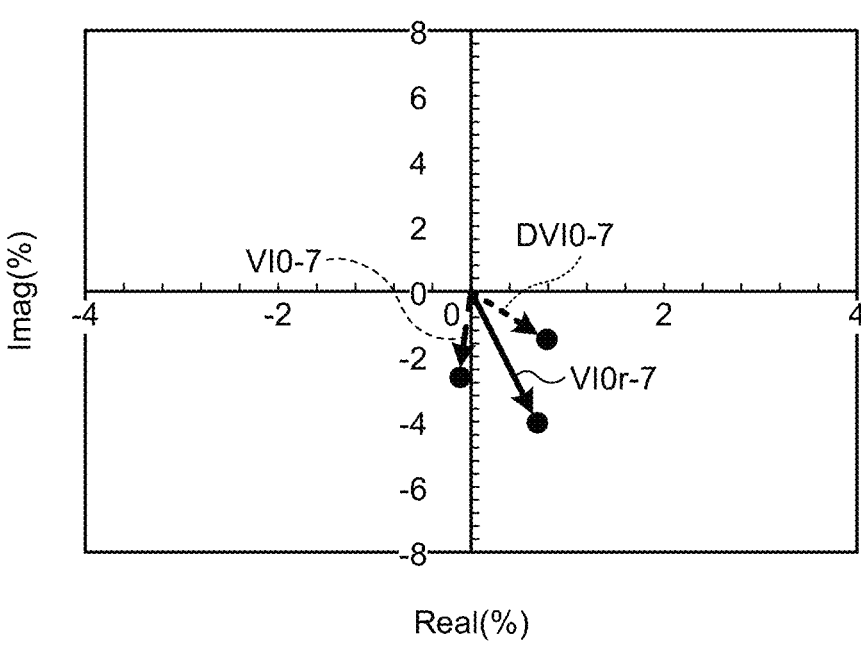
FIG. 7 is an explanatory diagram of a septenary zero sequence current vector and a septenary reference zero sequence current vector.

FIG. 7 is an explanatory diagram of a septenary zero sequence current vector and a septenary reference zero sequence current vector.

Similarly, the current difference vector calculation module 26 calculates the primary zero sequence current difference vector DVI0_1, a tertiary zero sequence current difference vector DVI0_3, a quinary zero sequence current difference vector DVI0_5, and a septenary zero sequence current difference vector DVI0_7, and a primary negative sequence current difference vector DVI2_1, a tertiary negative sequence current difference vector DVI2_3, a quinary negative sequence current difference vector DVI2_5, and a septenary negative sequence current difference vector DVI2_7.

The square sum calculation module 27 calculates the square sum of the primary zero sequence current difference vector DVI0_1 to the septenary zero sequence current difference vector DVI0_7 that have been calculated by the current difference vector calculation module 26.

Similarly, the square sum calculation module 27 calculates the square sum of the primary negative sequence current difference vector DVI2_1 to the septenary negative sequence current difference vector DVI2_7 that have been calculated by the current difference vector calculation module 26.

The determination module 28 compares the square sum SS0 of the primary zero sequence current difference vector DVI0_1 to the septenary zero sequence current difference vector DVI0_7 and the square sum SS2 of the primary negative sequence current difference vector DVI2_1 to the septenary negative sequence current difference vector DVI2_7 with a first threshold Vth1 (=corresponds to a warning value) and a second threshold Vth2 (=corresponds to a fault value) that respectively correspond to the square sums, and outputs a result of determination.

Next, an operation according to the embodiment is described.

Figure 8:
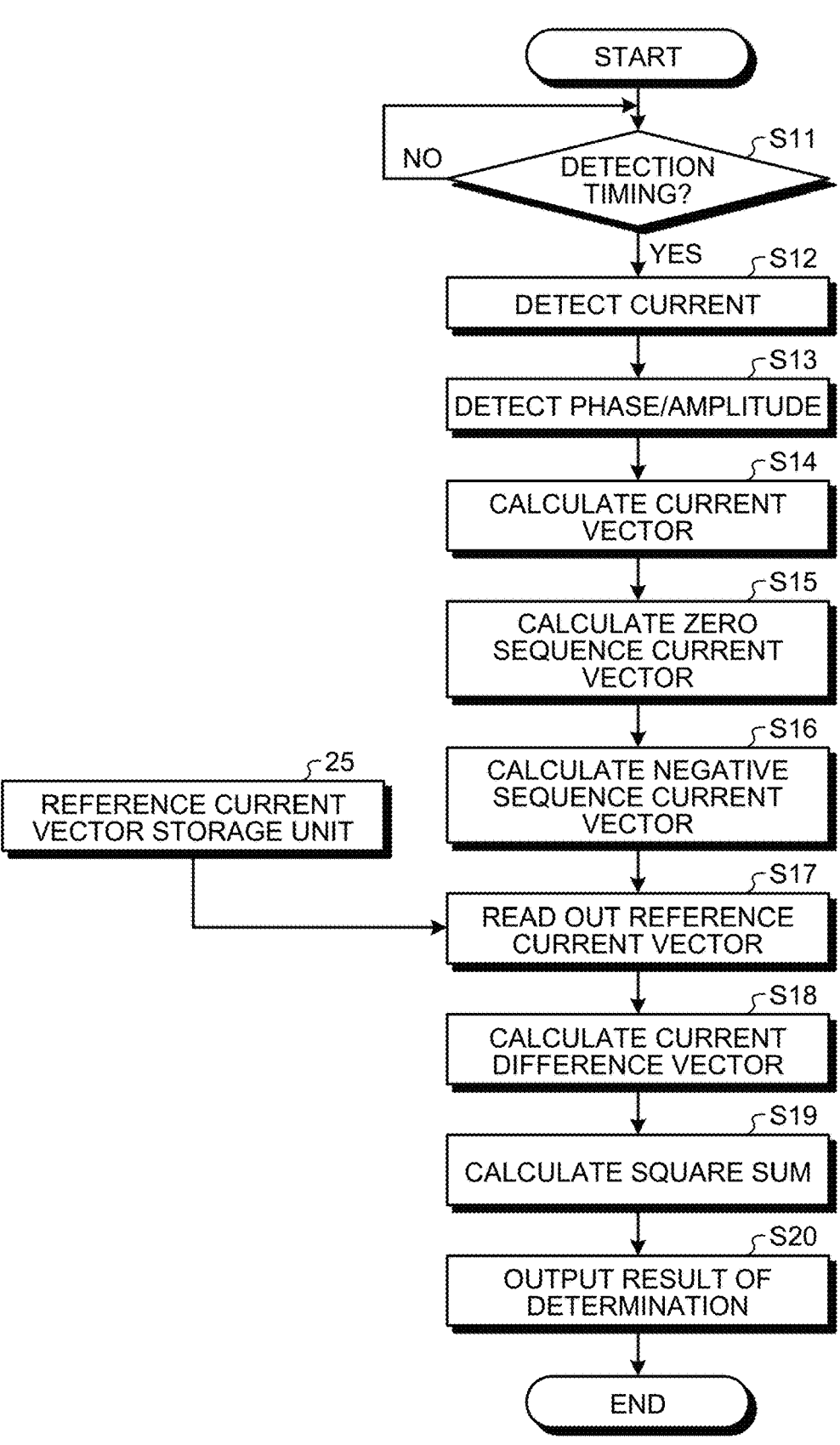
FIG. 8 is a flowchart of operation processing according to the embodiment.

FIG. 8 is a flowchart of operation processing according to the embodiment.

First, the diagnostic device 12 determines whether it is a timing of detection of a fault such as a ground fault or a layer short circuit (Step S11).

In the determination of Step S11, in a case where it has not yet been a timing of detection (Step S11; No), it enters into a standby state.

In the determination of Step S11, in a case where it is a timing of detection (Step S11; Yes), the first current transformer 11U, the second current transformer 11V, and the third current transformer 11W detect the U-phase current Iu, the V-phase current Iv, and the W-phase current Iw (Step S12).

Next, the diagnostic device 12 functions as the phase/amplitude detection module 21, and detects the phase of the U-phase current Iu, the phase of the V-phase current Iv, the phase of the W-phase current Iw, the amplitude of the U-phase current Iu, the amplitude of the V-phase current Iv, and the amplitude of the W-phase current Iw on the basis of the U-phase current Iu, the V-phase current Iv, and the W-phase current Iw that have been detected (Step S13).

Then, the diagnostic device 12 functions as the basic current vector calculation module 22, calculates the U-phase current vector VIu on the basis of the phase of the U-phase current Iu and the amplitude of the U-phase current Iu, calculates the V-phase current vector VIv on the basis of the phase of the V-phase current Iv and the amplitude of the V-phase current Iv, and calculates the W-phase current vector VIw on the basis of the phase of the W-phase current Iw and the amplitude of the W-phase current Iw (Step S14).

Next, the diagnostic device 12 functions as the zero sequence current vector calculation module 23, and calculates each of the primary zero sequence current vector VI0_1, which is a primary frequency component of the zero sequence current vector VI0, a tertiary zero sequence current vector VI0_3, which is a tertiary frequency component of the zero sequence current vector VI0, a quinary zero sequence current vector VI0_5, which is a quinary frequency component of the zero sequence current vector VI0, and a septenary zero sequence current vector VI0_7, which is a septenary frequency component of the zero sequence current vector VI0 (Step S15).

Then, the diagnostic device 12 functions as the negative sequence current vector calculation module 24, and calculates the negative sequence current vector VI2 according to the following formula on the basis of the U-phase current vector VIu, the V-phase current vector VIv, and the W-phase current vector VIw that have been calculated (Step S16).

$$\vec{VI2} = \left( \vec{VIu} + a^2 \vec{VIv} + a \vec{VIw} \right)$$

Here, "a" is a vector operator, and is expressed as the following:

$$a = -\frac{1}{2} + j\frac{\sqrt{3}}{2}$$

More specifically, the diagnostic device 12 serves as the negative sequence current vector calculation module 24, and calculates each of a primary negative sequence current vector VI2_1, which is a primary frequency component of the negative sequence current vector VI2, a tertiary negative sequence current vector VI2_3, which is a tertiary frequency component of the negative sequence current vector VI2, a quinary negative sequence current vector VI2_5, which is a quinary frequency component of the negative sequence current vector VI2, and a septenary negative sequence current vector VI2_7, which is a septenary frequency component of the negative sequence current vector VI2.

Next, the diagnostic device 12 reads out the reference zero sequence current vector VI0r and the reference negative sequence current vector VI2r that are stored in the reference current vector storage unit 25 (Step S17).

As a result of this, the diagnostic device 12 functions as the current difference vector calculation module 26, calculates, as the zero sequence current difference vector DVI0, a difference between the zero sequence current vector VI0 that has been calculated by the zero sequence current vector calculation module 23 and the reference zero sequence current vector VI0r that has been read out from the reference current vector storage unit 25, and calculates, as the negative sequence current difference vector DVI2, a difference between the negative sequence current vector VI2 that has been calculated by the negative sequence current vector calculation module 24 and the reference negative sequence current vector VI2r that has been read out from the reference current vector storage unit 25 (Step S18).

More specifically, the diagnostic device 12 serves as the current difference vector calculation module 26, and calculates, as the primary zero sequence current difference vector DVI0_1, a difference between the primary zero sequence current vector VI0_1 that is the primary frequency component of the zero sequence current vector VI0 that has been calculated by the zero sequence current vector calculation module 23, and the primary reference zero sequence current vector VI0r_1 that is the primary frequency component of the reference zero sequence current vector VI0r that has been read out from the reference current vector storage unit 25.

Similarly, the diagnostic device 12 serves as the current difference vector calculation module 26, and calculates, as the tertiary zero sequence current difference vector DVI0_3, a difference between the tertiary zero sequence current vector VI0_3 that is the tertiary frequency component of the zero sequence current vector VI0 that has been calculated by the zero sequence current vector calculation module 23, and the tertiary reference zero sequence current vector VI0r_3 that is the tertiary frequency component of the reference zero sequence current vector VI0r that has been read out from the reference current vector storage unit 25.

Furthermore, the diagnostic device 12 serves as the current difference vector calculation module 26, and calculates, as the quinary zero sequence current difference vector DVI0_5, a difference between the quinary zero sequence current vector VI0_5 that is the quinary frequency component of the zero sequence current vector VI0 that has been calculated by the zero sequence current vector calculation module 23, and the quinary reference zero sequence current vector VI0r_5 that is the quinary frequency component of the reference zero sequence current vector VI0r that has been read out from the reference current vector storage unit 25.

Similarly, the diagnostic device 12 serves as the current difference vector calculation module 26, and calculates, as the septenary zero sequence current difference vector DVI0_7, a difference between the septenary zero sequence current vector VI0_7 that is the septenary frequency component of the zero sequence current vector VI0 that has been calculated by the zero sequence current vector calculation module 23, and the septenary reference zero sequence current vector VI0r_7 that is the septenary frequency component of the reference zero sequence current vector VI0r that has been read out from the reference current vector storage unit 25.

Furthermore, the diagnostic device 12 serves as the current difference vector calculation module 26 to handle a negative sequence current vector, and calculates, as the primary negative sequence current difference vector DVI2_1, a difference between the primary negative sequence current vector VI2_1 that is the primary frequency component of the negative sequence current vector VI2 that has been calculated by the negative sequence current vector calculation module 24, and the primary reference negative sequence current vector VI2r_1 that is the primary frequency component of the reference negative sequence current vector VI2r that has been read out from the reference current vector storage unit 25.

Similarly, the diagnostic device 12 serves as the current difference vector calculation module 26, and calculates, as the tertiary negative sequence current difference vector DVI2_3, a difference between the tertiary negative sequence current vector VI2_3 that is the tertiary frequency component of the negative sequence current vector VI2 that has been calculated by the negative sequence current vector calculation module 24, and the tertiary reference negative sequence current vector VI2r_3 that is the tertiary frequency component of the reference negative sequence current vector VI2r that has been read out from the reference current vector storage unit 25.

Furthermore, the diagnostic device 12 serves as the current difference vector calculation module 26, and calculates, as the quinary negative sequence current difference vector DVI2_5, a difference between the quinary negative sequence current vector VI2_5 that is the quinary frequency component of the negative sequence current vector VI2 that has been calculated by the negative sequence current vector calculation module 24, and the quinary reference negative sequence current vector VI2r_5 that is the quinary frequency component of the reference negative sequence current vector VI2r that has been read out from the reference current vector storage unit 25.

Furthermore, the diagnostic device 12 serves as the current difference vector calculation module 26, and calculates, as the septenary negative sequence current difference vector DVI2_7, a difference between the septenary negative sequence current vector VI2_7 that is the septenary frequency component of the negative sequence current vector VI2 that has been calculated by the negative sequence current vector calculation module 24, and the septenary reference negative sequence current vector VI2r_7 that is the septenary frequency component of the reference negative sequence current vector VI2r that has been read out from the reference current vector storage unit 25.

As a result of these, the diagnostic device 12 functions as the square sum calculation module 27, calculates the square sum of the primary zero sequence current difference vector DVI0_1 to the septenary zero sequence current difference vector DVI0_7 that have been calculated by the current difference vector calculation module 26, outputs the square sum to the determination module 28, and calculates the square sum of the primary negative sequence current difference vector DVI2_1 to the septenary negative sequence current difference vector DVI2_7 that have been calculated by the current difference vector calculation module 26 (Step S19).

As a result of this, the diagnostic device 12, functions as the determination module 28, compares the square sum SS0 of the primary zero sequence current difference vector DVI0_1 to the septenary zero sequence current difference vector DVI0_7 and the square sum SS2 of the primary negative sequence current difference vector DVI2_1 to the septenary negative sequence current difference vector DVI2_7 with the first threshold Vth1 (=corresponds to the warning value) and the second threshold Vth2 (=corresponds to the fault value) that respectively correspond to the square sums, and outputs, as a result of determination, a normal signal NM, a warning signal WN, or a fault signal AL (Step S20).

Here, the square sum SS0 and the square sum SS2 are expressed according to the formulae described below.

$$SS0 = \sqrt{([DV10\_1]^2 + [DV10\_3]^2 + [DV10\_5]^2 + [DV10\_7]^2)}$$

$$SS2 = \sqrt{([DV12\_1]^2 + [DV12\_3]^2 + [DV12\_5]^2 + [DV12\_7]^2)}$$

Figure 9:
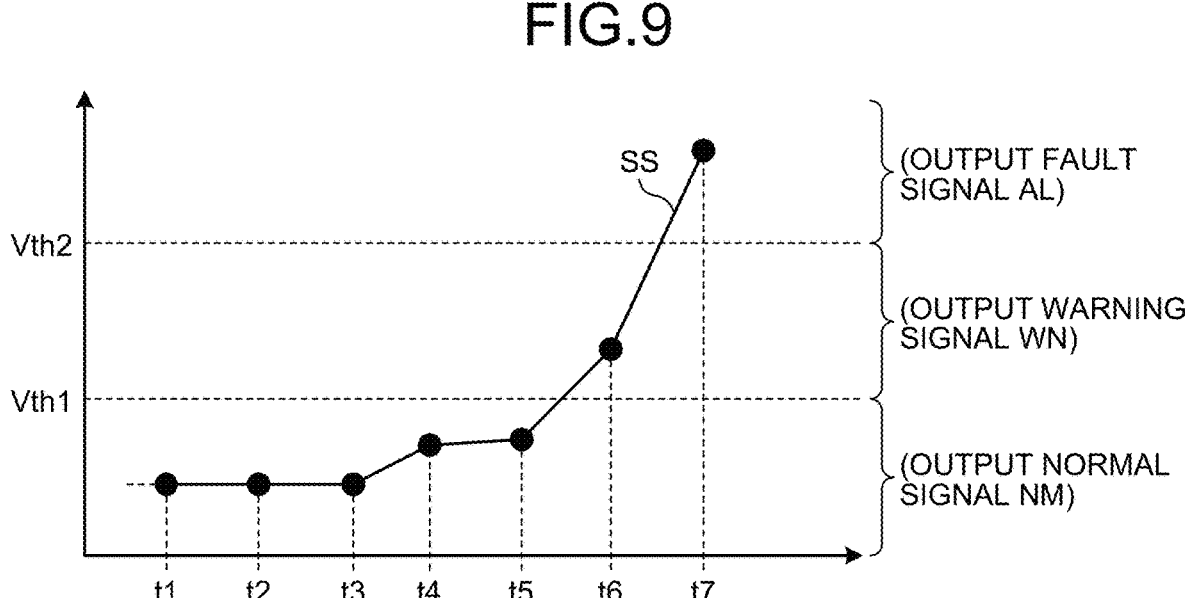
FIG. 9 is an explanatory diagram of examples of the square sum, a first threshold, and a second threshold.

FIG. 9 is an explanatory diagram of examples of the square sum, the first threshold, and the second threshold.

FIG. 9 illustrates a change with time in the square sum SS (the square sum SS0 or the square sum SS2) at a predetermined detection timing (in the case of the example of FIG. 9, time t1 to time t7).

As illustrated in FIG. 9, from time t1 to time t3, the square sum SS hardly changes, and is less than the first threshold Vth1, and therefore the determination module 28 outputs the normal signal NM that corresponds to a result indicating normality.

Then, at time t4 and time t5, the square sum SS has increased in comparison with the cases of time t1 to time t3, but is still less than the first threshold Vth1, and therefore the determination module 28 outputs the normal signal NM that corresponds to a result indicating normality.

In contrast to these, at time t6, the square sum SS has increased, exceeds the first threshold Vth1, and is less than the second threshold Vth2, and therefore the determination module 28 determines that it is in a state where there is a high probability of the ground fault or the layer short circuit, and outputs the warning signal WN.

Moreover, at time t7, the square sum SS has further increased, and exceeds the second threshold Vth2, and therefore the determination module 28 determines that it is in a fault state where the ground fault or the layer short circuit has occurred, and outputs the fault signal AL.

As described above, according to the present embodiment, the primary reference zero sequence current vector VI0r_1 to the septenary reference zero sequence current vector VI0r_7 and the primary reference negative sequence current vector VI2r_1 to the septenary reference negative sequence current vector VI2r_7, which are values in an initial state (a normal state) of the primary zero sequence current vector VI0__1 to the septenary zero sequence current vector VI0_7 that are primary to septenary components of the zero sequence current vector VI0, and the primary negative sequence current vector VI2_1 to the septenary negative sequence current vector VI2_7 that are primary to septenary components of the negative sequence current vector VI2, are grasped.

Then, the primary zero sequence current difference vector DVI0_1 to the septenary zero sequence current difference vector DVI0_7 and the primary negative sequence current difference vector DVI2_1 to the septenary negative sequence current difference vector DVI2_7 are calculated on the basis of the primary zero sequence current vector VI0_1 to the septenary zero sequence current vector VI0_7 and the primary negative sequence current vector VI2_1 to the septenary negative sequence current vector VI2_7 that have been detected in an operation state of the three-phase AC motor M.

Moreover, a deterioration sign state in which there is a high probability that the ground fault, the layer short circuit, or the like will occur is detected in real time on the basis of the primary zero sequence current difference vector DVI0_1 to the septenary zero sequence current difference vector DVI0_7 and the primary negative sequence current difference vector DVI2_1 to the septenary negative sequence current difference vector DVI2_7 that have been calculated, or a fault state of the ground fault, the layer short circuit, or the like can be detected in real time.

The embodiment of the present invention that has been described above is not restrictive of the scope of the invention, and is merely an example included in the scope of the invention. An embodiment of the present invention may be embodied by making changes, omissions, and additions of, for example, at least some of the specific purposes, structures, shapes, workings, and effects to the embodiment described above without departing from the gist of the invention.

For example, in the description above, with respect to the zero sequence current vector and the negative sequence current vector, the zero sequence current difference vector and the negative sequence current difference vector have been respectively obtained. However, a configuration in which an insulation diagnosis is made by using either the zero sequence current difference vector or the negative sequence current difference vector can also be employed.

Furthermore, in the description above, processing has been performed on current vectors of a primary frequency and a tertiary frequency, a quinary frequency, and a septenary frequency that serve as higher-order frequencies. However, processing may be performed on current vectors of the primary frequency and at least one higher-order frequency.

EXPLANATIONS OF LETTERS OR NUMERALS

10 INSULATION DIAGNOSTIC DEVICE, 11U FIRST CURRENT TRANSFORMER, 11V SECOND CURRENT TRANSFORMER, 12 DIAGNOSTIC DEVICE, 21 PHASE/AMPLITUDE DETECTION MODULE, 22 CURRENT VECTOR CALCULATION MODULE, 23 ZERO SEQUENCE CURRENT VECTOR CALCULATION MODULE, 24 NEGATIVE SEQUENCE CURRENT VECTOR CALCULATION MODULE, 25 REFERENCE CURRENT VECTOR STORAGE UNIT, 26 CURRENT DIFFERENCE VECTOR CALCULATION MODULE, 27 SQUARE SUM CALCULATION MODULE, 28 DETERMINATION MODULE, AL FAULT SIGNAL, DVI0_1 to DVI0_7 PRIMARY ZERO SEQUENCE CURRENT DIFFERENCE VECTOR TO SEPTENARY ZERO SEQUENCE CURRENT DIFFERENCE VECTOR, DVI2_1 to DVI2_7 PRIMARY NEGATIVE SEQUENCE CURRENT DIFFERENCE VECTOR TO SEPTENARY NEGATIVE SEQUENCE CURRENT DIFFERENCE VECTOR, Iu U-PHASE CURRENT, Iv V-PHASE CURRENT, IW W-PHASE CURRENT, M THREE-PHASE AC MOTOR, NM NORMAL SIGNAL, SS, SS0, SS2 SQUARE SUM, VIu U-PHASE CURRENT VECTOR, Viv V-PHASE CURRENT VECTOR, VIw W-PHASE CURRENT VECTOR, VI0 ZERO SEQUENCE CURRENT VECTOR, VI0_1 to VI0_7 PRIMARY ZERO SEQUENCE CURRENT VECTOR TO SEPTENARY ZERO SEQUENCE CURRENT VECTOR, VI0r REFERENCE ZERO SEQUENCE CURRENT VECTOR, VI0r_1 to VI0r_7 PRIMARY REFERENCE ZERO SEQUENCE CURRENT VECTOR TO SEPTENARY REFERENCE ZERO SEQUENCE CURRENT VECTOR, VI2 NEGATIVE SEQUENCE CURRENT VECTOR, VI2_1 to VI2_7 PRIMARY NEGATIVE SEQUENCE CURRENT VECTOR TO SEPTENARY NEGATIVE SEQUENCE CURRENT VECTOR, VI2r REFERENCE NEGATIVE SEQUENCE CURRENT VECTOR, VI2r_1 to VI2r_7 PRIMARY REFERENCE NEGATIVE SEQUENCE CURRENT VECTOR TO SEPTENARY REFERENCE NEGATIVE SEQUENCE CURRENT VECTOR, Vth1 FIRST THRESHOLD, Vth2 SECOND THRESHOLD, WN WARNING SIGNAL

The invention claimed is:

1. An insulation diagnostic device that performs an insulation diagnosis of a three-phase AC motor on a basis of a U-phase current, a V-phase current, and a W-phase current that are supplied to the three-phase AC motor, the insulation diagnostic device comprising:

a current vector calculation module configured to calculate at least one of a zero sequence current vector or a negative sequence current vector on the basis of the U-phase current, the V-phase current, and the W-phase current;

a reference current vector storage unit configured to store a reference current vector in advance;

a current difference vector calculation module configured to calculate a current difference vector that is a difference between a current vector calculated by the current vector calculation module and the reference current vector; and

11 a determination module configured to determine an insulation state of the three-phase AC motor on the basis of the current difference vector.

2. The insulation diagnostic device according to claim 1, wherein the current vector calculation module includes a zero sequence current vector calculation module and a negative sequence current vector calculation module, the zero sequence current vector calculation module being configured to calculate the zero sequence current vector on the basis of the U-phase current, the V-phase current, and the W-phase current, and the negative sequence current vector calculation module being configured to calculate the negative sequence current vector on the basis of the U-phase current, the V-phase current, and the W-phase current, the reference current vector storage unit is configured to store, in advance, a reference zero sequence current vector and a reference negative sequence current vector as the reference current vector, the current difference vector calculation module is configured to calculate a zero sequence current difference vector and a negative sequence current difference vector, the zero sequence current difference vector being a difference between the calculated zero sequence current vector and the reference zero sequence current vector, and the negative sequence current difference vector being a difference between the calculated negative sequence current vector and the reference negative sequence current vector, and the determination module is configured to determine the insulation state of the three-phase AC motor on the basis of the zero sequence current difference vector and the negative sequence current difference vector.

3. The insulation diagnostic device according to claim 2, wherein the zero sequence current vector calculation module is configured to calculate a plurality of zero sequence current vectors corresponding to a primary frequency and a higher-order frequency, the negative sequence current vector calculation module is configured to calculate a plurality of negative sequence current vectors corresponding to the primary frequency and the higher-order frequency, the reference current vector storage unit is configured to store, in advance, reference zero sequence current vectors corresponding to the primary frequency and the higher-order frequency, and reference negative sequence current vectors corresponding to the primary frequency and the higher-order frequency, the current difference vector calculation module is configured to calculate a plurality of zero sequence current difference vectors respectively corresponding to the primary frequency and the higher-order frequency, and a plurality of negative sequence current difference vectors respectively corresponding to the primary frequency and the higher-order frequency, the insulation diagnostic device further comprises a square sum calculation module configured to calculate a square sum of the plurality of zero sequence current difference vectors and a square sum of the plurality of negative sequence current difference vectors, and the determination module is configured to determine the insulation state of the three-phase AC motor on the basis of the square sum of the plurality of zero sequence current difference vectors and the square sum of the plurality of negative sequence current difference vectors.

4. The insulation diagnostic device according to claim 3, wherein the determination module is configured to:

compare the square sum of the plurality of zero sequence current difference vectors or the square sum of the plurality of negative sequence current difference vectors with a predetermined first threshold, and determine, when the square sum exceeds the first threshold, that the three-phase AC motor is in an insulation deterioration sign state in which there is a sign that leads to an insulation deterioration state; and compare the square sum of the plurality of zero sequence current difference vectors or the square sum of the plurality of negative sequence current difference vectors with a predetermined second threshold greater than the first threshold, and determine, when the square sum exceeds the second threshold, that the three-phase AC motor is in a fault state that is the insulation deterioration state.

5. An insulation diagnostic method comprising:

calculating at least one of a zero sequence current vector or a negative sequence current vector on the basis of a U-phase current, a V-phase current, and a W-phase current, the U-phase current, the V-phase current and the W-phase current being all supplied to a three-phase AC motor;

calculating a current difference vector that is a difference between the calculated current vector and a predetermined reference current vector; and determining whether an insulation state of the three-phase AC motor is an insulation deterioration sign state or a fault state on the basis of the current difference vector and a predetermined threshold, in real time during operation of the three-phase AC motor.

6. A non-transitory computer-readable medium storing a program which, when executed by a processor, causes the processor to perform a method comprising:

calculating at least one of a zero sequence current vector or a negative sequence current vector on the basis of a U-phase current, a V-phase current, and a W-phase current, the U-phase current, the V-phase current and the W-phase current being all supplied to a three-phase AC motor;

calculating a current difference vector that is a difference between the calculated current vector and a predetermined reference current vector; and determining whether an insulation state of the three-phase AC motor is an insulation deterioration sign state or a fault state on the basis of the current difference vector and a predetermined threshold, in real time during operation of the three-phase AC motor.

* * * * *